US012674818B2

(12) United States Patent
Fecher et al.

(10) Patent No.: US 12,674,818 B2
(45) Date of Patent: Jul. 7, 2026

(54) STRIP-SHAPED COMPOSITE MATERIAL FOR PROBE NEEDLES

(71) Applicant: Heraeus Deutschland Gmbh & Co. KG, Hanau (DE)

(72) Inventors: Jonas Fecher, Hanau (DE); Marc Schumann, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 443 days.

(21) Appl. No.: 18/447,683

(22) Filed: Aug. 10, 2023

(65) Prior Publication Data

US 2024/0061016 A1 Feb. 22, 2024

(30) Foreign Application Priority Data

Aug. 16, 2022 (EP) ..................................... 22190456

(51) Int. Cl.
| | |
|---|---|
| *B32B 15/01* | (2006.01) |
| *G01R 1/067* | (2006.01) |
| *G01R 3/00* | (2006.01) |

(52) U.S. Cl.
CPC ........... *G01R 1/06761* (2013.01); *G01R 3/00* (2013.01)

(58) Field of Classification Search
None
See application file for complete search history.

(56) References Cited

U.S. PATENT DOCUMENTS

| | | | |
|---|---|---|---|
| 1,913,423 | A | 6/1933 | Wise |
| 5,833,774 | A | 11/1998 | Klein et al. |
| 10,385,424 | B2 | 8/2019 | Klein et al. |
| 11,746,397 | B2 | 9/2023 | Fecher et al. |
| 11,920,227 | B2 | 3/2024 | Takahashi et al. |
| 2006/0197542 | A1 | 9/2006 | Tanaka |
| 2010/0194415 | A1 | 8/2010 | Wajata |
| 2010/0239453 | A1 | 9/2010 | Obata |
| 2012/0286816 | A1 | 11/2012 | Kister |
| 2013/0099813 | A1 | 4/2013 | Hoshino et al. |
| 2014/0176172 | A1 | 6/2014 | Stevenson et al. |
| 2014/0266278 | A1 | 9/2014 | Yeh |
| 2014/0377129 | A1 | 12/2014 | Shishino et al. |
| 2016/0252547 | A1 | 9/2016 | Sörensen et al. |
| 2017/0307657 | A1 | 10/2017 | Crippa et al. |
| 2019/0064215 | A1 | 2/2019 | Park |

(Continued)

FOREIGN PATENT DOCUMENTS

| | | |
|---|---|---|
| DE | 69635227 T2 | 6/2006 |
| DE | 102019130522 A1 | 5/2021 |

(Continued)

*Primary Examiner* — Kim S. Horger
(74) *Attorney, Agent, or Firm* — Blank Rome LLP

(57) ABSTRACT

A strip-shaped sandwich composite material for producing probe needles, wherein an inner core layer is arranged between two outer cover layers, wherein the inner core layer consists of a palladium alloy comprising at least 30 wt. % palladium or of a platinum alloy comprising at least 30 wt. % platinum, and wherein the two outer cover layers consist of a precipitation-hardened and/or dispersion-hardened copper alloy comprising at least 90 wt. % copper and/or silver alloy comprising at least 70 wt. % silver. The invention also relates to a probe needle, a bonding strip, a probe needle array and a method for producing a composite material.

19 Claims, 5 Drawing Sheets

(56)     References Cited

U.S. PATENT DOCUMENTS

Figure 1:
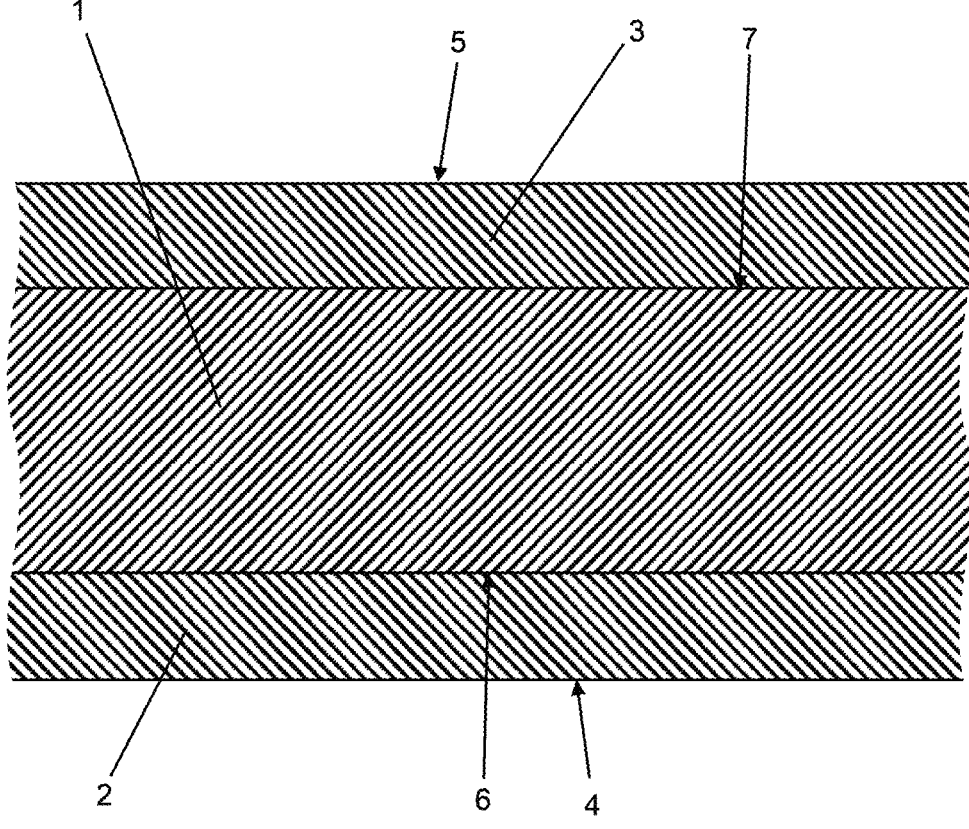

2019/0101569  A1      4/2019  Albertson et al.
2021/0241935  A1*     8/2021  Rättig  ..................... H01B 1/02

FOREIGN PATENT DOCUMENTS

| | | | |
|---|---|---|---|
| EP | 2060921 | A1 | 5/2009 |
| EP | 2139012 | A1 | 12/2009 |
| EP | 2159581 | A1 | 3/2010 |
| EP | 2248920 | A1 | 11/2010 |
| EP | 3878986 | A1 | 9/2021 |
| EP | 3960890 | A1 | 3/2022 |
| EP | 3862759 | B1 | 5/2022 |
| GB | 354216 | A | 7/1931 |
| JP | 2006064511 | A | 3/2006 |
| WO | 2016009293 | A1 | 1/2016 |
| WO | 2016107729 | A1 | 7/2016 |
| WO | 2021180421 | A1 | 9/2021 |

* cited by examiner

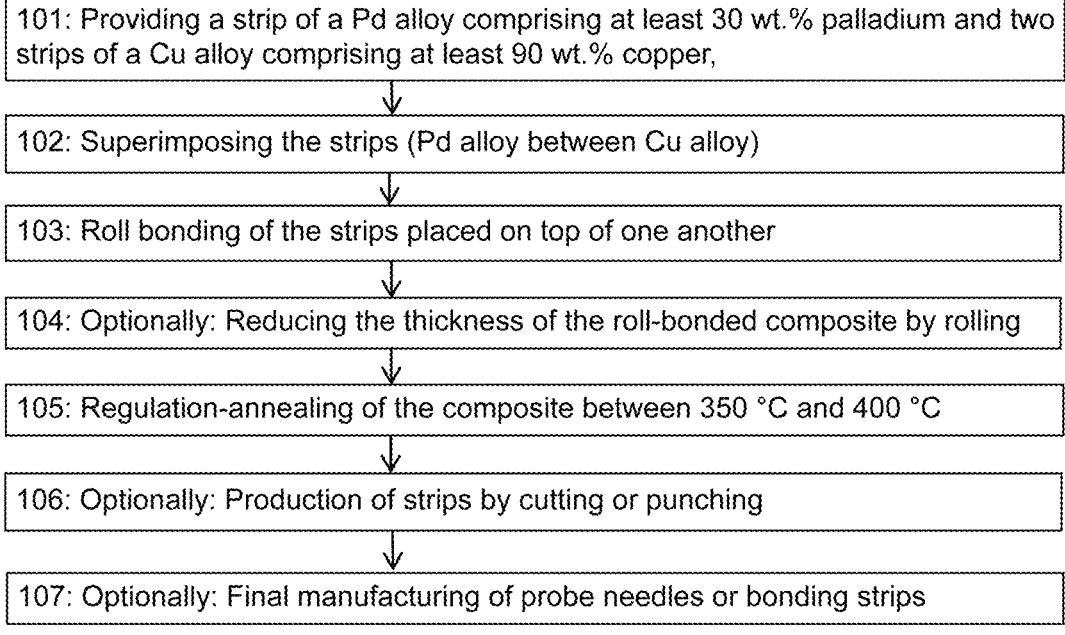

101: Providing a strip of a Pd alloy comprising at least 30 wt.% palladium and two strips of a Cu alloy comprising at least 90 wt.% copper, 102: Superimposing the strips (Pd alloy between Cu alloy)

103: Roll bonding of the strips placed on top of one another

104: Optionally: Reducing the thickness of the roll-bonded composite by rolling

105: Regulation-annealing of the composite between 350 °C and 400 °C

106: Optionally: Production of strips by cutting or punching

107: Optionally: Final manufacturing of probe needles or bonding strips

Figure 5

STRIP-SHAPED COMPOSITE MATERIAL FOR PROBE NEEDLES

CROSS-REFERENCE TO RELATED APPLICATIONS

This application claims priority pursuant to 35 U.S.C. 119(a) to European Application No. 22190456.8, filed Aug. 16, 2022, which application is incorporated herein by reference in its entirety.

FIELD

The invention relates to a strip-shaped, sandwich-like layered composite material, from which probe needles for electronic testing of semiconductor elements can be punched or cut, and a probe needle, a bonding strip and a probe needle array, which is produced from or using such a strip-shaped sandwich-like layered composite material.

The invention also relates to a method for producing such a strip-shaped, sandwich-like layered composite material from two different materials from strips.

BACKGROUND

Besides probe needles, bonding strips or bonding wires, which benefit from the same physical properties as probe needles, can also be manufactured from the composite material. Bonding strips are strip-shaped bonding wires.

During chip production, after processing, wafers are contacted directly by probe needles in order to test the functionality of integrated circuits (IC) in the unsawn state. In this case, after the structuring of the individual chips, an array of probe needles tests the semiconductor wafer for functionality. The probe needles are fixed in a test card (probe card) which is matched to the design of the wafer. In the testing process, the wafer is pressed onto the probe needles, and contact between probe needles and the pads of the ICs is established. Various parameters are then tested, such as the contacting, electrical characteristics at high current density, and the electrical behavior during temperature changes.

Probe needles are thus used in the production of power electronics, the contacting of chips and other electrical circuits for testing the quality of electrical contacts (see, for example, US 2014/0266278 A1 and US 2010/0194415 A1).

Applications, such as probe needles or bonding strips in power electronics, also require high mechanical strength and hardness, in addition to high electrical conductivity. Furthermore, the temperature resistance or the heat resistance is of critical importance.

The key parameters of a good probe needle are high electrical conductivity since high electrical currents have to be transmitted during testing of the ICs for power electronics, as well as high hardness in order to keep the maintenance intervals low. In addition, probe needles and bonding strips benefit from a low modulus of elasticity ($m_E$) and a high yield strength ($Rp_{0.2}$), which produce good spring properties. A high thermal conductivity brings about a good dissipation of the thermal energy and thus as low as possible an additional thermal increase of the electrical resistance. Suitable hardness, modulus of elasticity and yield strength are required in order firstly to keep the maintenance intervals low and secondly to realize good spring properties of the probe needle.

The electrical conductivity of pure copper (100% IACS=58.1*10$^6$ S/m) serves as a reference for determining the electrical conductivity. Pure copper (Cu) and pure silver (Ag), however, cannot be used for these purposes since they are significantly too ductile and the probe needle would deform during use.

Applications, such as probe needles or bonding strips in power electronics, also require high mechanical strength and hardness, in addition to high electrical conductivity. In this case, the temperature resistance or the heat resistance is also of critical importance.

As materials for probe needles, precipitation hardened copper alloys, rhodium alloys (Rh alloys) or palladium alloys (Pd alloys) are currently used, which are processed by chill casting, solution annealing, precipitation heat treatment and rolling to form thin strips having a thickness of less than 55 μm.

For use on gold pads, palladium alloys are known, such as Paliney® H3C from the company Deringer Ney or New-Tec® from the company Advanced Probing. Typical materials for probe needles are precipitation-hardened palladium-silver alloys that can contain 10 wt. % gold and 10 wt. % platinum and are, for example, marketed under the product names Paliney® 7, Hera 6321, and Hera 648. US 2014/377 129 A1 and U.S. Pat. No. 5,833,774 A disclose hardened Ag—Pd—Cu alloys for electrical applications. These alloys have a high hardness of 400-500 HV. However, at 9-12% IACS, the electrical conductivity is rather low. High electrical conductivity is a critical factor in the case of probe needles.

For testing on aluminum pads, probe needles made of the materials tungsten, tungsten carbide, palladium-copper-silver alloys, and tungsten rhenium are widely used. The latter are particularly hard, aluminum pads being more robust than gold pads and being better able to withstand testing with hard needles than gold pads are. These probe needles also do not have a very high electrical conductivity. Alloys having higher electrical conductivity, such as CuAg7, are less hard (approx. 320 HV1) and less heat-resistant than palladium-silver alloys or palladium-copper-silver alloys.

Furthermore, PtNi30 alloys for probe needles exist on the market. US 2010/0239453 A1 and EP 2-248 920 A1 disclose low-doped iridium alloys for the production of probe needles.

US 2006/0197542 A1 discloses a platinum base alloy for producing probe needles. The alloys have a high hardness between 300 HV and 500 HV, in order to be able to produce a good contact by a lacquer layer arranged on the gold pads.

Palladium-copper-silver alloys which are suitable in principle are already known from U.S. Pat. No. 1,913,423 A and GB 354 216 A. Palladium-copper-silver alloy can form a structure with a superlattice, which leads to an improvement in the electrical conductivity and the mechanical stability of the alloy. The atoms in the lattice are then no longer randomly distributed, but they are ordered in periodic structures, the superlattice. As a result, hardnesses of more than 350 HV1 (Vickers hardness test according to DIN EN ISO 6507-1:2018 to −4:2018 with a test force of 9.81 N (1 kilopond)), electrical conductivities of more than 19.5% IACS, and breaking strengths of up to 1500 MPa are possible. While palladium alloys, such as the palladium-copper-silver-ruthenium/rhodium alloy known from EP 3 960 890 A1 and the platinum base alloys known from the prior art have very good mechanical properties even at high temperatures, the electrical conductivity and the thermal conductivity are less good compared to copper and copper alloys.

However, PtNi alloys (platinum-nickel alloys) or rhodium (Rh) are also used as materials for films for the production of probe needles. In the case of such metals or alloys, which represent the best possible compromise between electrical conductivity, thermal conductivity, tensile strength and hardness, the maximum possible electrical conductivity is 5% to 30% IACS and is therefore rather low compared to copper.

U.S. Pat. No. 10,385,424 B2 discloses a palladium-copper-silver alloy additionally containing up to 5 wt. % rhenium. This palladium-copper-silver alloy is marketed under the product name Paliney® 25. In this way, the electrical conductivity can be significantly increased and reaches values of more than 19.5% IACS. However, a disadvantage here is that rhenium has a very high melting point of 3180° C. and therefore has to be alloyed with the other metals in a complicated manner.

WO 2016/009293 A1 proposes a probe needle, a tip being arranged on the front side of the probe needle, which tip consists of a mechanically hard first material and the remainder of the probe needle consists of a second material having a high electrical conductivity. Similar probe needles are also known from US 2013/0099813 A1, US 2016/0252547 A1, EP 2 060 921 A1 and US 2012/0286816 A1. US 2019/0101569 A1 proposes a sheathed wire comprising such a tip, the tip being fastened only to the wire core of the sheathed wire. In this case, the sheathed wire should have a wire core having a single coating. A disadvantage here is that the probe needle no longer has homogeneous physical properties over its length and that the electrical and thermal conductivity, but also the tensile strength, depend very significantly on the bond between the two materials. In addition, a low electrical conductivity in one region cannot simply be compensated by a high electrical conductivity in another region, since the current must pass both regions, as in the case of series circuits of electrical resistors.

As composite wires for producing probe needles or bonding wires, it is possible to use, for example, wires which are coated all around, which can be produced as what are known as sheathed wires or double wires by continuous rolling processes or with the aid of galvanic coatings. For example, these can have, in the interior, a non-noble metal, for example of a Cu alloy, such as CuBe2, coated with a noble metal alloy (for example Hera238), in order to be able to be used for applications in contact technology in the case of sliding contacts in slip ring transmitters or also switching contacts in microswitches, as is described in DE 10 2019 130 522 A1.

In order to improve the electrical conductivity of the probe needles, pure copper is currently also deposited galvanically on palladium alloys. Galvanic coating of rhodium base alloys for producing a sheathed wire as a probe needle is known from EP 3 862 759 B1. Further coated probe needles are known from WO 2016/107729 A1, US 2017/0307657 A1 and US 2014/0176172 A1.

A disadvantage here is that pure copper has only a low hardness and heat resistance, and poor spring properties, as a result of which the mechanical properties of the composite material produced in this way from palladium alloy and copper are negatively influenced.

It would therefore be desirable to improve the galvanically coated palladium alloys such that an improvement in the electrical conductivity can be achieved without simultaneous deterioration, or with reduced deterioration, of the mechanical properties of the composite material and of the probe needles or bonding strips produced therefrom.

SUMMARY

The object of the invention is therefore to overcome the disadvantages of the prior art. In particular, a composite material for the production therefrom (and specifically by punching or cutting) of probe needles for the electronic testing of semiconductor elements, as well as a method for producing such a composite material should be found, in which the composite material has an improved electrical conductivity compared to palladium alloys, without the mechanical properties, in particular the tensile strength and the hot tensile strength and preferably also the hardness, deteriorating in this process in such a way as is the case with the palladium alloys coated galvanically with pure copper. The composite material and the method should be simple and inexpensive to realize and suitable for mass production. Probe needles and bonding strips should be able to be produced from the composite material in a manner that is as simple as possible and cost-effective, the tip of the probe needle preferably being intended to consist of a hard palladium alloy or platinum alloy. Furthermore, the composite material should have a bond between the materials of the composite material that is as mechanically stable as possible.

The objects of the invention are achieved by a composite material according to claim 1, by a probe needle or a bonding strip according to claim 9, by a probe needle array according to claim 11, by the use of a composite, a probe needle or a probe needle array according to claim 12, and by a method according to claim 13. Preferred embodiments are disclosed in dependent claims 2 to 8, 10, 14 and 15.

The objects of the invention are achieved by a composite material for producing probe needles for electronic testing of semiconductor elements, the composite material being strip-shaped and being delimited by two mutually parallel main surfaces, the composite material being layered perpendicularly to the parallel main surfaces and having a sandwich construction comprising an inner core layer and two outer cover layers, the inner core layer being arranged between the two outer cover layers, and the inner core layer being firmly connected on two opposite sides to the two outer cover layers, the two outer cover layers forming the parallel main surfaces, the inner core layer consisting of a palladium alloy comprising at least 30 wt. % palladium or of a platinum alloy comprising at least 30 wt. % platinum, and the two outer cover layers consisting of a precipitation-hardened and/or dispersion-hardened copper alloy comprising at least 90 wt. % copper, or of a precipitation-hardened and/or dispersion-hardened silver alloy comprising at least 70 wt. % silver, or of a precipitation-hardened and/or dispersion-hardened copper alloy comprising at least 90 wt. % copper and of a precipitation-hardened and/or dispersion-hardened silver alloy comprising at least 70 wt. % silver.

Precipitation-hardened copper alloys and silver alloys result in high hardness and tensile strength.

Dispersion hardened copper alloys and silver alloys result in high hardness and tensile strength, even at high temperatures.

The precipitation-hardened and/or dispersion-hardened copper alloy and the precipitation-hardened and/or dispersion-hardened silver alloy may be both precipitation-hardened and dispersion-hardened.

In the case of precipitation hardening of an alloy, precipitation in the alloy results from temperature treatment. In the case of dispersion hardening of an alloy, dispersoids are distributed in the alloy. The dispersoids can be distributed as particles in the melt before solidification. Such dispersoids are frequently oxides or borides, according to the invention preferably metal oxides.

The parallel main surfaces form the largest surface of the strip-shaped composite material. The parallel main surfaces preferably form at least 50% of the surface of the strip-shaped composite material, particularly preferably the parallel main surfaces form at least 90% of the surface of the strip-shaped composite material, very particularly preferably the parallel main surfaces form at least 99% of the surface of the strip-shaped composite material.

The strip-shaped composite material is preferably in the shape of a flat cuboid, in a first approximation or in a good approximation.

The two outer cover layers can consist of different copper alloys or silver alloys. It is also possible for one of the two outer cover layers to consist of a copper alloy and the other of the two outer cover layers to consist of a silver alloy. However, it is preferred according to the invention that the two outer cover layers consist of the same copper alloy or silver alloy, particularly preferably of the same copper alloy.

The main surfaces that are in parallel with one another do not have to form completely parallel or plane-parallel surfaces in the mathematical sense. It is sufficient if the main surfaces in parallel with one another are inclined relative to one another up to an angle of at most 5°. Preferably, the main surfaces in parallel with one another are inclined with respect to one another at an angle of at most 1°.

The main surfaces that are in parallel with one another are also preferably plane-parallel.

Preferably, the main surfaces that are in parallel with one another are planar surfaces. Here too, a planar surface does not mean a surface that is planar to an atomic range, but rather a planar surface, as is produced during rolling.

The probe needles and bonding strips can be produced from the strip-shaped composite material by cutting strips of the composite material perpendicularly to the parallel main surfaces or also diagonally to the parallel main surfaces. In addition, one end of the needle can be pointed, and preferably in such a way that the material of the inner core layer forms a tip of the probe needle. This tip can then be used to test a semiconductor structure with regard to its electrical conductivity, by pressing the tip onto the semiconductor surface to be examined and measuring the electrical conductivity via the probe needle.

In the present case, impurities is understood to mean impurities caused by the synthesis of all elements involved.

If the material can be used as a probe needle, then it is also suitable for use as a bonding strip or bonding wire.

The inner core layer and the two outer cover layers are preferably metal.

Precipitation-hardened and dispersion-hardened copper alloys and silver alloys result in a high hardness and tensile strength of the composite material, even at high temperatures (approximately 300° C.).

It can preferably be provided that the inner core layer is joined to the two outer cover layers, in particular joined by roll bonding.

It can be provided that the strip-shaped composite material has a thickness of at most 300 μm, preferably has a thickness of at most 100 μm.

The thickness of the composite material corresponds to the distance between the two main planes formed by the outer surfaces of the two outer cover layers.

Thicker composite materials cannot easily be used as probe needles by cutting or punching the composite material, without additional rolling.

Furthermore, it can be provided that the thickness of the inner core layer is at least equal to the thickness of the two outer cover layers, preferably at least twice as thick as the thickness of the two outer cover layers.

It can also be provided that the thickness of the inner core layer is at most ten times as thick as the thickness of the two outer cover layers, preferably at most five times as thick as the thickness of the two outer cover layers, particularly preferably at most three times as thick as the thickness of the two outer cover layers.

This ensures that the physical properties of the composite are determined by the materials of the cover layers and the core layer together.

It can be provided that the inner core layer is directly connected to the two outer cover layers.

This means that no further layers, such as an adhesive layer and/or a diffusion protection layer, are arranged between the inner core layer and the two outer cover layers.

This measure makes it easy and cost-effective to produce the composite material. It has been found that, in the production of the composite material according to the invention by means of a method according to the invention, no additional intermediate layer is required. A diffusion layer can result between the inner core layer and the two outer cover layers during roll bonding and during subsequent heat treatment. This is not considered to be a separate (further) layer in the sense of the present invention, but as a connection in the region of the boundary surface between the inner core layer and the two outer cover layers.

Furthermore, it can be provided that the composite material consists of the inner core layer and the outer cover layers.

This makes it clear that the composite material does not require any further layers or parts. As a result, the composite material is cost-effective to produce.

Alternatively, for example, the two outer cover layers could be coated on the main surfaces or a material could be applied to an edge of the composite material for electrical contacting of the probe needles.

It can also be provided that the two outer cover layers consist of a precipitation-hardened and/or dispersion-hardened copper alloy comprising at least 90 wt. % copper, preferably of a precipitation-hardened and/or dispersion-hardened copper alloy comprising at least 97 wt. % copper, particularly preferably of a precipitation-hardened and/or dispersion-hardened copper alloy comprising at least 99 wt. % weight copper.

Precipitation-hardened and dispersion-hardened copper alloys having high copper content are particularly well suited for the production of probe needles since they have a high electrical conductivity with a relatively high hardness and tensile strength for copper alloys having a high copper content.

It can preferably also be provided that the inner core layer consists of a palladium alloy containing at least 30 wt. % palladium, preferably of a palladium alloy containing at least 35 wt. % palladium, particularly preferably of a palladium-copper-silver alloy according to EP 3 960 890 A1.

Preferably, the inner core layer consists of a palladium-copper-silver alloy containing at least 35 wt. % palladium, at least 20 wt. % copper and at least 20 wt. % silver, particularly preferably of a palladium-copper-silver alloy containing 31 wt. % copper and 29 wt. % silver, up to 6 wt. % of at least one element selected from the group consisting of rhodium, ruthenium and rhenium, and the remainder of palladium including impurities.

Particularly preferably, the inner core layer consists of a palladium-copper-silver alloy according to EP 3 960 890 A1. In this case, the particularly preferred palladium-copper-silver alloy is described in paragraph [0013] of EP 3 960 890

A1. Very particularly preferred embodiments are described in paragraphs [0021] to [0048] and [0067] of EP 3 960 890 A1.

Such palladium alloys result in a particularly high tensile strength and heat resistance of the composite material and the probe needles and bonding strips produced therefrom.

It can also be provided that the composite material has an electrical conductivity, measured using a four-point measurement method at room temperature, on one of the two outer cover layers of at least 35% IACS (20.3 $\times 10^6$ S/m), preferably of at least 40% IACS (23.2 $\times 10^6$ S/m), particularly preferably of at least 45% IACS (26.1 $\times 10^6$ S/m).

Furthermore, it can be provided that the composite material has a Vickers hardness HV0.05 at room temperature in the two cover layers of at least 170, preferably of at least 190, particularly preferably of at least 196.

Furthermore, it can be provided that the composite material has a tensile strength at room temperature in parallel with the plane of the inner core layer of at least 1000 MPa, preferably of at least 1100 MPa.

It can also be provided that the composite material has a yield strength at room temperature in parallel with the plane of the inner core layer of at least 950 MPa, preferably of at least 1050 MPa.

These physical properties of the composite material can be realized with the composite material according to the invention and bring about advantageous material properties for the probe needles and bonding strips produced therefrom. In particular, the combinations of these physical properties bring about very good properties for the probe needles and bonding strips. In particular the combination of the high electrical conductivity with high tensile strength is advantageous for probe needles and bonding strips.

The electrical conductivity can be determined by means of a 4-pole measurement of the voltage drop on the test object at a defined length, using a Burster Resistomat 2316. The measurement is carried out on the main surfaces of the composite material having an area having an edge length of 5 mm or more, a thickness of 55 μm and a measurement current of 10 mA.

Furthermore, it can be provided that the composite material has a 0.2% yield point $Rp_{0.2}$ (elasticity limit) of at least 1000 MPa, preferably of at least 1150 MPa, particularly preferably of 1300 MPa, at room temperature.

These mechanical and electrical properties, and in particular the combination thereof, ensure that the composite material has particularly good resilient properties and a high electrical conductivity, in order to be able to use this as a probe needle or bonding strip.

The 0.2% yield point $Rp_{0.2}$ can be determined using a Zwick tensile tester Z250. The tensile test can be carried out on a composite material having a thickness of 50 μm and a width of 13 mm, and is based herein. The test speed with respect to the yield strength $Rp_{0.2}$ is 1 mm/min.

Furthermore, it can be provided that the precipitation-hardened and/or dispersion-hardened copper alloy is a precipitation-hardened and/or dispersion-hardened copper-chromium alloy comprising at least 98 wt. % copper, in particular a precipitation-hardened and/or dispersion-hardened CuCr1Zr alloy comprising at least 0.5 wt. % and at most 1.2 wt. % chromium, and comprising at least 0.03 wt. % to at most 0.3 wt. % zirconium, and the remainder copper, including impurities.

It can also be provided that the precipitation-hardened and/or dispersion-hardened copper alloy is a precipitation-hardened copper-chromium-titanium alloy comprising at least 99 wt. % copper, in particular a precipitation-hardened copper-chromium titanium-silicon alloy comprising 0.3 wt. % chromium, 0.1 wt. % titanium, 0.02 wt. % Si and the remainder copper, including impurities.

Furthermore, it can be provided that the precipitation-hardened and/or dispersion-hardened copper alloy is a precipitation-hardened copper-chromium-silver alloy comprising at least 98 wt. % copper, in particular a precipitation-hardened copper-chromium-silver-iron-titanium-silicon alloy comprising 0.5 wt. % chromium, 0.2 wt. % silver, 0.08 wt. % iron, 0.06 wt. % titanium, 0.03 wt. % Si and the remainder copper, including impurities.

These copper alloys are particularly preferred according to the invention.

Furthermore, it can be provided that the precipitation-hardened and/or dispersion-hardened copper alloy is a precipitation-hardened and/or dispersion-hardened copper-silver alloy comprising at least 90 wt. % copper, in particular a precipitation-hardened and/or dispersion-hardened copper-silver alloy comprising at least 3 wt. % silver to at most 7 wt. % silver, and the remainder of copper, including impurities, or the remainder copper, including impurities and including 0 wt. % to at most 2 wt. % oxidic dispersoids.

Such a copper alloy comprising 3 wt. % silver (CuAg3) is particularly preferred according to the invention.

Furthermore, it can be provided that the precipitation-hardened and/or dispersion-hardened silver alloy is a silver-copper alloy comprising at least 70 wt. % silver, preferably a silver-copper alloy comprising at least 9 wt. % copper and at most 29 wt. % copper and the remainder silver, including impurities, particularly preferably a silver-copper alloy comprising 10 wt. % copper and the remainder silver, including impurities, or a silver-copper alloy comprising 28 wt. % copper and the remainder silver, including impurities.

It can also be provided that the palladium alloy is a palladium-copper-silver alloy comprising palladium as the main component, the palladium-copper-silver alloy having a weight ratio of palladium to copper of at least 1.05 and at most 1.6 and having a weight ratio of palladium to silver of at least 3 and at most 6, and the palladium-copper-silver alloy containing more than 1 wt. % and up to at most 6 wt. % ruthenium, rhodium or ruthenium and rhodium, and as the remainder palladium, copper and silver and at most 1 wt. % other metal elements, including impurities, preferably less than 0.3 wt. % iridium.

This palladium-copper-silver alloy is particularly preferred according to the invention.

A weight ratio of palladium to copper of at least 1.05 and at most 1.6 means that the palladium is contained in the palladium-copper-silver alloy at a weight of at least 105% and at most 160% of the weight of the copper contained in the palladium-copper-silver alloy.

Accordingly, a weight ratio of palladium to silver of at least 3 and at most 6 means that the palladium is contained in the palladium-copper-silver alloy at a weight of at least three times and at most six times the weight of the silver contained in the palladium-copper-silver alloy.

Furthermore, it can be provided that the palladium alloy is a palladium-silver-copper-platinum alloy, in particular a palladium-silver-copper-platinum-zinc-gold alloy comprising 38 wt. % silver, 15 wt. % copper, 1.5 wt. % platinum, 1 wt. % zinc, 0.5 wt. % gold, and the remainder palladium, including impurities, or a palladium-copper-platinum-gold-zinc alloy comprising 30 wt. % silver, 14 wt. % copper, 10 wt. % platinum, 10 wt. % gold, 1 wt. % zinc, and the remainder palladium, including impurities.

It can also be provided that the palladium alloy is a palladium-copper-silver-ruthenium alloy, in particular a palladium-copper-silver-ruthenium alloy comprising 36.5 wt. % copper, 10.5 wt. % silver, 1.5 wt. % ruthenium, and the remainder palladium, including impurities, or a palladium-copper-silver-ruthenium-rhenium alloy comprising 36.5 wt. % copper, 10.5 wt. % silver, 1.1 wt. % ruthenium, 0.4 wt. % rhenium, and the remainder palladium, including impurities.

Furthermore, it can be provided that the palladium alloy is a palladium-copper-silver-rhodium alloy, in particular a palladium-copper-silver-rhodium alloy comprising 36.5 wt. % copper, 10.5 wt. % silver, 1.5 wt. % rhodium, and the remainder palladium, including impurities.

Furthermore, it can be provided that the palladium alloy is a palladium-copper-silver alloy, in particular a palladium-copper-silver alloy comprising 31 wt. % copper, 29 wt. % silver, and the remainder palladium, including impurities.

Furthermore, it can be provided that the palladium alloy is a palladium-silver-copper alloy, in particular a palladium-silver-copper alloy comprising 38 wt. % silver, 15 wt. % copper, and the remainder palladium, including impurities.

It can also be provided that the platinum alloy is a platinum-nickel alloy, preferably a platinum-nickel alloy comprising at least 3 wt. % and at most 10 wt. % nickel, and the remainder platinum, including impurities, particularly preferably a platinum-nickel alloy comprising 5 wt. % nickel, and the remainder platinum, including impurities.

In the aforementioned alloys, the element having the highest proportion by weight in the alloy is always mentioned first. Preferably, the element having the second highest proportion by weight in the alloy is preferably mentioned second. Particularly preferably, the element having the third highest proportion by weight in the alloy is mentioned third. Very particularly preferably, in the case of the alloys mentioned, the alloying components mentioned are ordered in their sequence according to their proportion by weight.

In the present case, a main component is understood to mean the element (in this case palladium, platinum, copper or silver) which is primarily, i.e., by amount, the largest component, i.e., that, for example, more palladium is contained in a palladium-copper-silver alloy than copper or silver.

These alloys are particularly well suited for producing the composite material according to the invention.

It can be provided that the precipitation-hardened and/or dispersion-hardened copper alloy comprises or comprise up to 2 wt. % precipitates and/or dispersoids, preferably comprises or comprise up to 1 wt. % precipitates and/or dispersoids, the precipitates and/or dispersoids consisting to at least 95 wt. % of at least one of the elements selected from the list consisting of chromium, titanium, silicon, iron, oxygen, zirconium and silver.

This small amount of precipitates and/or dispersoids is sufficient to improve the hardness of the copper alloy and, if applicable, also the silver alloy, without the electrical conductivity being very greatly reduced.

The proportion of precipitates and/or dispersoids can be determined by evaluating a cross-section of the copper alloy, by means of scanning electron microscopy or also light microscopy, with respect to the surface ratio of precipitates and/or dispersoids to the total area of the copper alloy, wherein it is necessary for the density of the precipitates and/or dispersoids and the matrix surrounding them to be taken into account for this purpose. The density can, for example, be determined on the basis of a composition analysis by means of energy-dispersive or wavelength-dispersive X-ray analysis (EDX or WDX) or by means of X-ray fluorescence.

It can be provided that the precipitation-hardened and/or dispersion-hardened silver alloy comprises or comprise up to 2 wt. % precipitates and/or dispersoids, preferably up to 1 wt. % precipitates and/or dispersoids, the precipitates and/or dispersoids consisting to at least 95 wt. % of at least one of the elements selected from the list consisting of chromium, titanium, silicon, iron, oxygen, zirconium and copper.

Furthermore, it can be provided that the inner core layer consists of a precipitation-hardened and/or dispersion-hardened palladium alloy, or of a precipitation-hardened and/or dispersion-hardened platinum alloy.

This improves the tensile strength of the composite material and the stability of the needle tip of the probe needles produced therefrom. Preferably, the inner core layer consists of a precipitation-hardened and/or dispersion-hardened palladium alloy.

The objects on which the present invention is based are also achieved by a probe needle or a bonding strip consisting of a strip of a composite material described above.

The probe needle and the bonding strip benefit from the advantageous physical properties of the composite material.

In this case, it can be provided that the probe needle has a tip which consists of the material of the inner core layer.

This achieves a high stability of the probe needle. The probe needle comprising this tip can consequently be used very often without having to be replaced or very frequently conditioned.

The objects on which the present invention is based are further achieved by a probe needle array comprising a plurality of aforementioned probe needles arranged next to one another.

The objects on which the present invention is based are also achieved by the use of a composite material described above or of a probe needle described above or of a probe needle array described above, for testing electrical contacts or for electrical contacting or for producing a sliding contact.

The objects on which the present invention is based are further achieved by a method for producing a composite material from two metal alloys, the composite material being suitable and provided for the production of probe needles for the electronic testing of semiconductor elements, and the method being characterized by the following chronologically successive steps:

a. providing a first strip of a palladium alloy comprising at least 30 wt. % palladium or of a platinum alloy comprising at least 30 wt. % platinum, and a second strip of a precipitation-hardened and/or dispersion-hardened copper alloy comprising at least 90 wt. % copper or of a precipitation-hardened and/or dispersion-hardened silver alloy comprising at least 70 wt. % silver, and a third strip of a precipitation-hardened and/or dispersion-hardened copper alloy comprising at least 90 wt. % copper, or of a precipitation-hardened and/or dispersion-hardened silver alloy comprising at least 70 wt. % silver, b. arranging the first strip between the second strip and the third strip, and placing the first strip against the second strip and against the third strip, and c. connecting the first strip to the second strip and the third strip by roll bonding the strips placed against one another, the roll bonding producing a continuous strip-shaped composite material from the materials of the first strip, the second strip and the third strip.

Preferably, during roll bonding, the thickness of the first strip, the second strip and the third strip is reduced.

The roll bonding may be performed in multiple steps, the thickness of the composite being reduced in each step.

In the method according to the invention, it can be provided that a step D) is carried out after step C):

D) temperature treatment of the composite produced in step C), the material of the first strip being precipitation-hardened and/or dispersion-hardened during the temperature treatment.

As a result of the downstream temperature treatment, the strips can be connected well to one another beforehand, by means of rollers.

Furthermore, it can be provided that a composite material described above is produced by means of the method, or that at least one probe needle described above or at least one bonding strip described above is produced by means of the method, by cutting or punching the composite material, preferably a plurality of probe needles or bonding strips described above is produced by means of the method, by cutting or punching.

The invention is based on the surprising finding that a layer of a solid and hard palladium alloy or platinum alloy can be coated on both sides with a precipitation-hardened copper alloy and/or silver alloy having higher electrical conductivity, in order to produce a sandwich-like and strip-shaped composite material, the mechanical properties of which, with respect to tensile strength and heat resistance, as well as hardness, are improved compared to a palladium alloy or platinum alloy coated with pure copper or pure silver, but at the same time a significant increase in the electrical conductivity is achieved compared to a pure hard palladium alloy or platinum alloy. It has surprisingly been found, in the context of the present invention, that such a coating with a precipitation-hardened copper alloy and/or silver alloy can be realized with the aid of roll-bonding methods, which it would not be possible to manufacture with a galvanic coating. The present invention is also based on the finding that, when they are of a similar hardness, the core layer and the two outer cover layers can be joined to one another well by roll bonding.

The composite material preferred according to the invention, consisting of a copper and a palladium alloy for line materials or probe needles advantageously combines the positive properties of copper alloys (high electrical conductivity) and palladium alloys (high heat resistance and good spring properties). This gives a material which has better conductivity than the existing palladium alloys (Hera 6321® or Paliney H3C®) and a better heat resistance and total hardness than CuAg7. The copper alloys used have four times the strength of pure copper at about 80% of the electrical conductivity of pure copper, and thus significantly better overall properties. These alloys, used during roll bonding, cannot be deposited using galvanic processes, which are generally limited to pure metals and a few selected alloys.

Multiple different layers of different metals and noble metals can also be applied galvanically, in order to achieve an advantageous property combination. However, no precipitation-hardening alloys can be deposited in this way, and this makes the process very complicated. During a final heat treatment, there is also the risk of diffusion, which has a negative effect on the electrical conductivity due to mixed crystal formation.

Work-hardening a palladium alloy, coated galvanically with copper, by further rolling is also conceivable. However, no consistent properties are to be expected here since copper and palladium alloys have significantly different hardnesses, resulting in non-uniform deformation.

BRIEF DESCRIPTION

Figure 2:
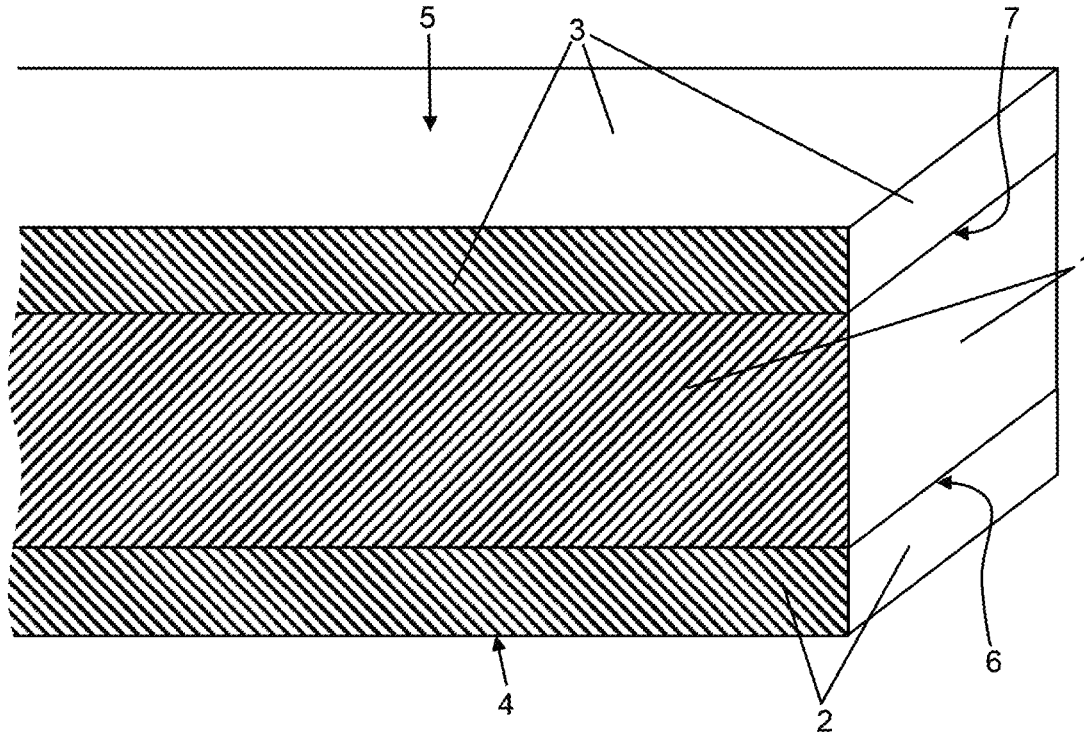
Figure 3:
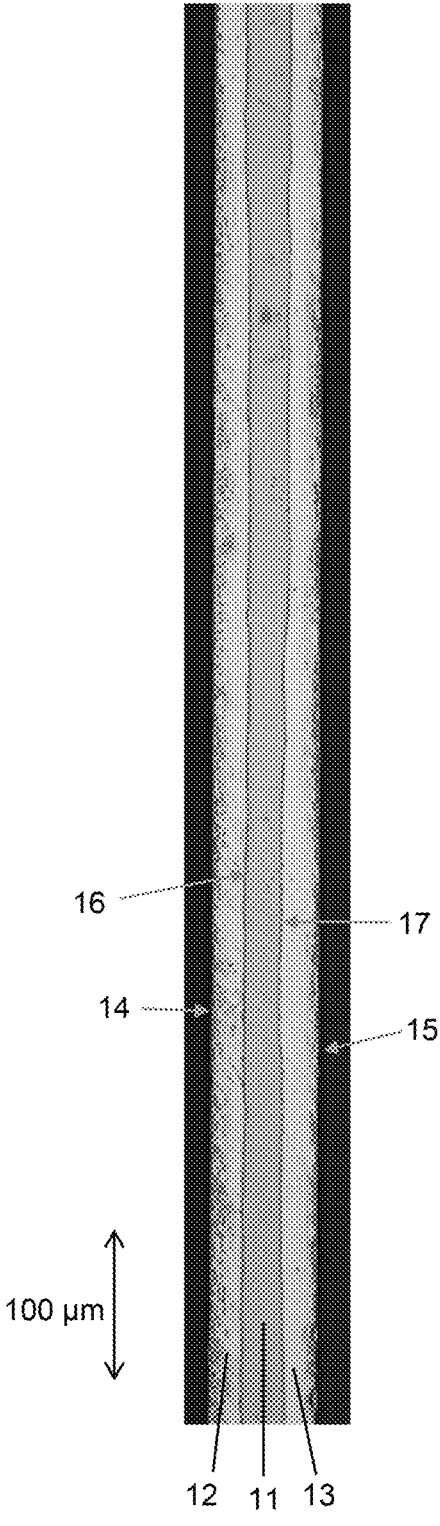
Figure 4:
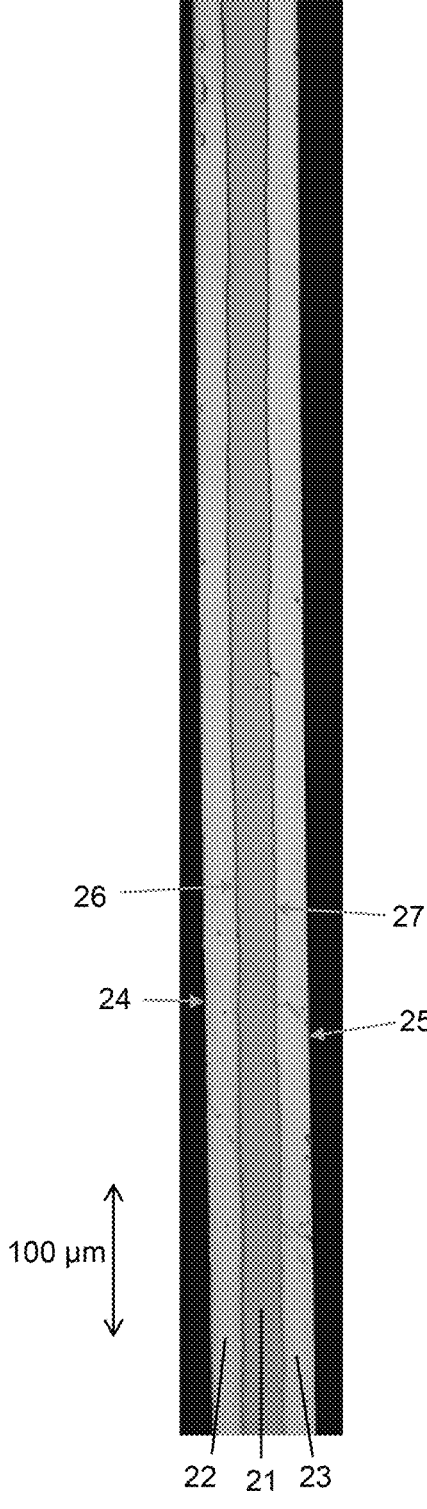

Further embodiments of the invention are explained below, with reference to four schematic figures, but without thereby limiting the invention. In the figures:

FIG. 1: shows a schematic cross-section through a detail of a composite material according to the invention;

FIG. 2: shows a schematic perspective cross-section through a detail of the composite material according to the invention according to FIG. 1;

FIG. 3: shows a light microscopy photograph of a polished cross-section of a composite material according to the invention;

FIG. 4: shows a light microscopy photograph of a polished cross-section of a further composite material according to the invention; and FIG. 5: shows a flow diagram of a method according to the invention.

DETAILED DESCRIPTION

FIGS. 1 and 2 show schematic cross-sections through a composite material according to the invention. The cross-sectional areas are shown hatched.

The composite material has an inner core layer 1 and two outer cover layers 2, 3.

The inner core layer 1 consists of a palladium alloy comprising at least 30 wt. % palladium or of a platinum alloy comprising at least 30 wt. % platinum. Each of the two outer cover layers 2, 3 can consist of a precipitation-hardened and/or dispersion-hardened copper alloy comprising at least 90 wt. % copper, or of a precipitation-hardened and/or dispersion-hardened silver alloy comprising at least 70 wt. % silver.

Preferably, the inner core layer 1 consists of a palladium alloy as described in EP 3 960 890 A1.

The two outer cover layers 2, 3 preferably consist of a precipitation-hardened and/or dispersion-hardened copper alloy comprising at least 90 wt. % copper, particularly preferably of a precipitation-hardened copper alloy comprising at least 98 wt. % copper.

The inner core layer 1 and the two outer cover layers 2, 3 can be firmly connected to one another and joined directly to one another by roll-bonding strips of the respective material.

The composite material has two opposing main surfaces 4, 5 which are formed by the outwardly directed surfaces of the cover layers 2, 3. The main surfaces 4, 5 can be arranged plane-parallel to one another. The composite material can form a flat cuboid, in a good approximation, the main surfaces 4, 5 preferably being larger than all other surfaces of the composite material together.

The inner core layer 1 and the two outer cover layers 2, 3 are joined to one another via boundary surfaces 6, 7. In the region of the boundary surfaces 6, 7, mixing of the materials of the two outer cover layers 2, 3 and the inner core layer 1 may occur.

For example, a composite material according to the invention can be produced as follows:

A sandwich composed of three metal sheets comprising a precipitation-hardened and/or dispersion-hardened copper alloy and/or a precipitation-hardened and/or dispersion-hardened silver alloy at the top and bottom, as well as a platinum alloy or a palladium alloy (in particular a palladium superlattice) in the middle, is rolled together in a roll pass having approximately 60-75% pass decrease, these three metal sheets being cold-welded and forming a composite. In this case, the hardnesses of the materials are very similar, which is achieved in that the precipitation-hardened and/or dispersion-hardened copper alloy and/or the precipitation-hardened and/or dispersion-hardened silver alloy, in the hardened state, is or are rolled with the palladium alloy or platinum alloy (in particular with a palladium superlattice alloy according to EP 3 960 890 A1) in the solution-annealed state. After rolling to the desired thickness of 30-60 μm, the hardness and the electrical conductivity of the platinum alloy or palladium alloy are adjusted by regulation-annealing at 380° C. for 5 minutes (preferably under vacuum or under protective gas). In this case, the electrical conductivity and strength of the palladium alloy or of the platinum alloy are considerably increased (see the palladium superlattice according to EP 3 960 890 A1), without the mechanical and electrical properties of the copper alloy and/or silver alloy being negatively influenced. The palladium alloy can likewise be produced analogously to the method described in EP 3 960 890 A1.

In order to carry out comparative measurements, a sheet of a palladium alloy having the composition of 36.5 wt. % copper, 10.5 wt. % silver, 1.5 wt. % ruthenium, and the remainder palladium, including less than 0.1 wt. % impurities, and produced according to EP 3 960 890 A1, and two sheets of a precipitation-hardened copper alloy Wieland-K75 (C18070) comprising 0.3 wt. % chromium, 0.1 wt. % titanium, 0.02 wt. % silicon, and the remainder copper, were rolled together. Subsequently, the composite was rolled to a thickness of 54 μm.

Two composite materials according to the invention, produced in this way, are shown in FIGS. 3 and 4 as light micrography photographs of cross-sections of the strip-shaped composite materials. The photographs were created using a Leica DM 6 light microscope with incident light. For this purpose, the composite materials were embedded in epoxy resin and ground and polished perpendicularly to the rolling plane. The epoxy resin appears black in FIGS. 3 and 4 and is not part of the composite material.

The composite material A shown in FIG. 3 accordingly has an inner core layer 11 made of a palladium alloy having the composition 36.5 wt. % copper, 10.5 wt. % silver, 1.5 wt. % ruthenium, and the remainder palladium, including less than 0.1 wt. % impurities. The core layer 11 is surrounded on both sides by two outer cover layers 12, 13 of a precipitation-hardened copper alloy Wieland-K75 (C18070) comprising 0.3 wt. % chromium, 0.1 wt. % titanium, 0.02 wt. % silicon, and the remainder copper. The two outer cover layers 12, 13 delimit the composite material A by respective main surfaces 14, 15, which form the major part of the surface of the composite material A. By means of the rolling, the inner core layer 11 and the two outer cover layers 12, 13 are joined together and firmly connected. An intermediate layer does not exist. The inner core layer 11 and the two outer cover layers 12, 13 are joined to one another via boundary surfaces 16, 17. In the region of the boundary surfaces 16, 17, mixing of the materials of the two outer cover layers 12, 13 and the inner core layer 11 may occur.

The composite material B shown in FIG. 4 analogously has an inner core layer 21 made of a palladium alloy having the composition 36.5 wt. % copper, 10.5 wt. % silver, 1.5 wt. % ruthenium, and the remainder palladium, including less than 0.1 wt. % impurities. The core layer 21 is surrounded on both sides by two outer cover layers 22, 23 of a precipitation-hardened copper alloy Wieland-K75 (C18070) comprising 0.3 wt. % chromium, 0.1 wt. % titanium, 0.02 wt. % silicon, and the remainder copper. The two outer cover layers 22, 23 delimit the composite material B by respective main surfaces 24, 25, which form the major part of the surface of the composite material B. By means of the rolling, the inner core layer 21 and the two outer cover layers 22, 23 are joined together and firmly connected. An intermediate layer does not exist here either. The inner core layer 21 and the two outer cover layers 22, 23 are joined to one another via boundary surfaces 26, 27. In the region of the boundary surfaces 26, 27, mixing of the materials of the two outer cover layers 22, 23 and the inner core layer 21 may occur.

Subsequently, the electrical conductivity was determined by means of a four-point measurement on one of the main surfaces 14, 15, 24, 25 of the composite materials A and B formed by the precipitation-hardened copper alloy. The four-point measurement method, also referred to as four-point measurement or four-tip measurement, is a method for determining the sheet resistance, i.e., the electrical resistance of a surface or thin layer. In the method, four measuring tips are brought onto the surface of the foil in a row, a known current flowing over the two outer measuring tips and the potential difference, i.e., the electrical voltage between the two inner measuring tips, being measured by means of these two inner measuring tips. Since the method is based on the principle of the four-conductor measurement, it is largely independent of the transition resistance between the measuring tips and the surface (Thomson bridge principle). Adjacent measuring tips respectively have the same distance. The sheet resistance R results from the measured voltage U and the current I according to the formula:

$$R = \frac{\pi}{\ln 2}\frac{U}{I}$$

In order to calculate the specific resistance ρ of the layer material from the sheet resistance R, the sheet resistance is multiplied by the thickness d (layer thickness) of the foil:

$$\rho = dR$$

The electrical conductivity results from the reciprocal of the specific resistance.

The hardness (HV0.05—Vickers hardness test according to DIN EN ISO 6507-1:2018 to −4:2018 with a test force of 0.4905 N (0.05 kilopond)), the strength was tested by means of tensile tests.

The composite materials A and B shown in FIGS. 3 and 4 were produced and investigated.

For the comparison, a palladium-copper-silver alloy having the product name Hera 6321 having the composition 39 wt. % Pd, 31 wt. % Cu, 29 wt. % Ag, 0.9 wt. % Zn and 0.1 wt. % by weight B was also investigated.

TABLE 1

| The measurement results of the electrical conductivity (IACS) and the hardness for the alloys investigated are listed below | | |
|---|---|---|
| | IACS [%] | Hardness [HV0.05] |
| Hera 6321 | 9-12 | 400-500 |
| Composite material A | 56.5 | 200 |
| Composite material B | 55.8 | 197 |

The measurements of composite materials A and B were carried out on sheets of thickness 54 μm. The Hera-6321 alloy was measured on a sheet of thickness 54 μm.

The sequence of a method according to the invention is described below with reference to FIG. 5 together with FIGS. 1 and 2.

In a first work step 101, a strip made of a palladium alloy comprising at least 30 wt. % palladium and two strips of a precipitation-hardened and/or dispersion-hardened copper alloy comprising at least 90 wt. % copper can be provided or produced.

In a second work step 102, the strip of the palladium alloy can be laid between the strips of the copper alloy.

In a third work step 103, the strips can be joined together by roll bonding, the thickness of the strips being reduced during the roll bonding.

In an optional fourth work step 104, the thickness of the composite produced in this way can be reduced by further rolling, in one or more steps, to the target thickness (for example to 50 μm).

In a fifth work step 105, the composite produced in this way can be regulation-annealed (for example at 380° C. for 5 minutes) in order to adjust the desired hardness of the middle core layer 1 of the palladium alloy.

In an optional sixth work step 106, the composite material can be cut or punched into strips.

Subsequently, a final production of probe needles or bonding strips can optionally take place in a seventh work step 107. For this purpose, for example, the core layers 1 of the strips can be machined as tips of the probe needles.

The features of the invention disclosed in the above description and in the claims, figures and embodiments, both individually and in any desired combination, can be essential for implementing the invention in its various embodiments.

LIST OF REFERENCE SIGNS

1, 11, 21 inner core layer
1, 11, 21 outer cover layer
3, 13, 23 outer cover layer
4, 14, 24 main surface
5, 15, 25 main surface
6, 16, 26 boundary surface
7, 17, 27 boundary surface
101 first work step
102 second work step
103 third work step
104 fourth work step
105 fifth work step
106 sixth work step
107 seventh work step

What is claimed is:

1. A composite material for producing probe needles for electronic testing of semiconductor elements, wherein the composite material is strip-shaped and is delimited by two mutually parallel main surfaces, wherein the composite material is layered perpendicularly to the parallel main surfaces and has a sandwich construction comprising an inner core layer and two outer cover layers, wherein the inner core layer is arranged between the two outer cover layers, and the inner core layer is firmly connected on two opposite sides to the two outer cover layers, wherein the two outer cover layers form the parallel main surfaces, wherein the inner core layer consists of a palladium alloy comprising at least 30 wt. % palladium or of a platinum alloy comprising at least 30 wt. % platinum, and wherein the two outer cover layers consist of a precipitation-hardened and/or dispersion-hardened copper alloy comprising at least 90 wt. % copper, or of a precipitation-hardened and/or dispersion-hardened silver alloy comprising at least 70 wt. % silver, or of a precipitation-hardened and/or dispersion-hardened copper alloy comprising at least 90 wt. % copper and of a precipitation-hardened and/or dispersion-hardened silver alloy comprising at least 70 wt. % silver.

2. The composite material according to claim 1, wherein the inner core layer is directly connected to the two outer cover layers, and/or the composite material consists of the inner core layer and the outer cover layers.

3. The composite material according to claim 1, wherein the two outer cover layers consist of a precipitation-hardened and/or dispersion-hardened copper alloy comprising at least 90 wt. % copper.

4. The composite material according to claim 1, wherein the inner core layer consists of a palladium alloy containing at least 30 wt. % palladium.

5. The composite material according to claim 1, wherein the composite material has an electrical conductivity, measured by means of a four-point measurement method at room temperature, on one of the two outer cover layers, of at least 35% IACS (20.3 $\times 10^6$ S/m), and/or
the composite material has a Vickers hardness HV0.05, at room temperature, in the two cover layers of at least 170, and/or
the composite material has a tensile strength at room temperature in parallel with the plane of the inner core layer of at least 1000 MPa, and/or
the composite material has a yield strength at room temperature in parallel with the plane of the inner core layer of at least 950 MPa.

6. The composite material according to claim 1, wherein the precipitation-hardened and/or dispersion-hardened copper alloy is a precipitation-hardened and/or dispersion-hardened copper-chromium alloy comprising at least 98 wt. % copper, or
the precipitation-hardened and/or dispersion-hardened copper alloy is a precipitation-hardened copper-chromium-titanium alloy comprising at least 99 wt. % copper, or
the precipitation-hardened and/or dispersion-hardened copper alloy is a precipitation-hardened copper-chromium-silver alloy comprising at least 98 wt. % copper, or
the precipitation-hardened and/or dispersion-hardened copper alloy is a precipitation-hardened and/or dispersion-hardened copper-silver alloy comprising at least 90 wt. % copper, and/or
the precipitation-hardened and/or dispersion-hardened silver alloy is a silver-copper alloy comprising at least 70 wt. % silver, and/or
the palladium alloy is a palladium-copper-silver alloy comprising palladium as the main component, wherein the palladium-copper-silver alloy has a weight ratio of palladium to copper of at least 1.05 and at most 1.6, and a weight ratio of palladium to silver of at least 3 and at most 6, and wherein the palladium-copper-silver alloy contains more than 1 wt. % and up to at most 6 wt. % ruthenium, rhodium or ruthenium and rhodium, and, as the remainder, palladium, copper and silver and at most 1 wt. % other metal elements, including impurities, or
the palladium alloy is a palladium-silver-copper-platinum alloy or a palladium-silver-copper-platinum-gold-zinc, or
the palladium alloy is a palladium-copper-silver-ruthenium alloy, or
the palladium alloy is a palladium-copper-silver-rhodium alloy, or
the palladium alloy is a palladium-copper-silver alloy, or
the palladium alloy is a palladium-silver-copper alloy, or the platinum alloy is a platinum-nickel alloy.

7. The composite material according to claim 1, wherein the precipitation-hardened and/or dispersion-hardened copper alloy comprises up to 2 wt. % precipitates and/or dispersoids, the precipitates and/or dispersoids consisting to at least 95 wt. % of at least one of the elements selected from the list consisting of chromium, titanium, silicon, iron, oxygen, zirconium and silver.

8. The composite material according to claim 1, wherein the inner core layer consists of a precipitation-hardened and/or dispersion-hardened palladium alloy, or of a precipitation-hardened and/or dispersion-hardened platinum alloy.

9. A probe needle or bonding strip consisting of a strip of a composite material according to claim 1.

10. The probe needle according to claim 9, wherein the probe needle has a tip that consists of a same material of the inner core layer.

11. A probe needle array having a plurality of probe needles according to claim 9 arranged next to one another.

12. A method for producing a composite material made of two metal alloys, wherein the composite material is suitable and provided for the production of probe needles for the electronic testing of semiconductor elements and wherein the method is characterized by the following chronologically successive steps:

A) providing a first strip of a palladium alloy comprising at least 30 wt. % palladium or of a platinum alloy comprising at least 30 wt. % platinum, and a second strip of a precipitation-hardened and/or dispersion-hardened copper alloy comprising at least 90 wt. % copper or of a precipitation-hardened and/or dispersion-hardened silver alloy comprising at least 70 wt. % silver, and a third strip of a precipitation-hardened and/or dispersion-hardened copper alloy comprising at least 90 wt. % copper, or of a precipitation-hardened and/or dispersion-hardened silver alloy comprising at least 70 wt. % silver, B) arranging the first strip between the second strip and the third strip, and placing the first strip against the second strip and against the third strip, and C) connecting the first strip to the second strip and the third strip by roll bonding the strips placed against one another, the roll bonding producing a continuous strip-shaped composite material from the materials of the first strip, the second strip and the third strip.

13. The method according to claim 12, wherein after step C), a step D) is performed:

D) temperature treatment of the composite produced in step C), the material of the first strip being precipitation-hardened and/or dispersion-hardened during the temperature treatment.

14. The method according to claim 12, wherein a composite material is produced by means of the method, or at least one probe needle or at least one bonding strip is produced by cutting or punching the composite material, preferably a plurality of probe needles or bonding strips produced by means of the method, by cutting or punching.

15. The composite material according to claim 1, wherein the two outer cover layers consist of a precipitation-hardened and/or dispersion-hardened copper alloy comprising at least 97 wt. % copper.

16. The composite material according to claim 1, wherein the inner core layer consists of a palladium alloy containing at least 35 wt. % palladium.

17. The composite material according to claim 1, wherein the precipitation-hardened and/or dispersion-hardened copper alloy comprises up to 1 wt. % precipitates and/or dispersoids, the precipitates and/or dispersoids consisting to at least 95 wt. % of at least one of the elements selected from the list consisting of chromium, titanium, silicon, iron, oxygen, zirconium and silver.

18. The composite material according to claim 1, wherein the composite material has an electrical conductivity, measured by means of a four-point measurement method at room temperature, on one of the two outer cover layers, of at least 40% IACS (23.2 ×10$^6$ S/m).

19. The composite material according to claim 1, wherein the composite material has a Vickers hardness HV0.05, at room temperature, in the two cover layers of at least 190, and/or
the composite material has a tensile strength at room temperature in parallel with the plane of the inner core layer of at least 1100 MPa, and/or
the composite material has a yield strength at room temperature in parallel with the plane of the inner core layer of at least 1050 MPa.

* * * * *